United States Patent [19]

Davis

[11] Patent Number: 5,781,766

[45] Date of Patent: Jul. 14, 1998

[54] PROGRAMMABLE COMPENSATING DEVICE TO OPTIMIZE PERFORMANCE IN A DRAM CONTROLLER CHIPSET

[75] Inventor: Ian E. Davis, Fremont, Calif.

[73] Assignee: National Semiconductor Corporation, Santa Clara, Calif.

[21] Appl. No.: 647,615

[22] Filed: May 13, 1996

[51] Int. Cl.$^6$ .......................................... G06F 1/16
[52] U.S. Cl. ............................... 395/552; 395/558
[58] Field of Search ........................... 395/552, 558; 364/490, 491

[56] References Cited

U.S. PATENT DOCUMENTS

4,421,996 12/1983 Chuang et al. ................ 307/530
5,329,254 7/1994 Takano ........................... 331/34

*Primary Examiner*—Thomas M. Heckler
*Attorney, Agent, or Firm*—Limbach & Limbach L.L.P.

[57] ABSTRACT

A programmable compensating device for optimizing performance in a DRAM controller chipset, comprising process monitors for measuring process speeds of integrated circuits in the chipset, evaluation means for comparing the measured process speeds and identifying a slowest integrated circuit, and delay modules for reducing measured process speeds as necessary to match the process speed of the slowest integrated circuit, whereby DRAM access time is minimized to permit more frequent DRAM accesses, thereby optimizing chipset performance.

18 Claims, 13 Drawing Sheets

PROGRAMMABLE COMPENSATING DEVICE TO OPTIMIZE PERFORMANCE IN A DRAM CONTROLLER CHIPSET

BACKGROUND OF THE INVENTION

1. Field of the Invention

This invention relates generally to integrated circuit performance over multiple chips, and more particularly to a system and method for using a programmable compensating device to optimize performance in a DRAM controller chipset.

2. Description of the Prior Art

Electronic components called integrated circuits are frequently designed to operate in conjunction with other compatible integrated circuits in groupings known as chipsets. In effect, a large or complex electronic circuit is partitioned across multiple integrated circuits or "chips." A dynamic random-access memory (DRAM) controller is an electronic apparatus which can be implemented using an integrated circuit chipset. When a computer central processing unit (CPU) and a DRAM operate together, the CPU provides a set of control signals to transfer data out of the DRAM. However, the DRAM requires a different set of control signals to perform the data retrieval functions. Therefore, an interface or DRAM controller is used to receive control signals from the CPU and convert them into other control signals understood by the DRAM.

Figure 1:
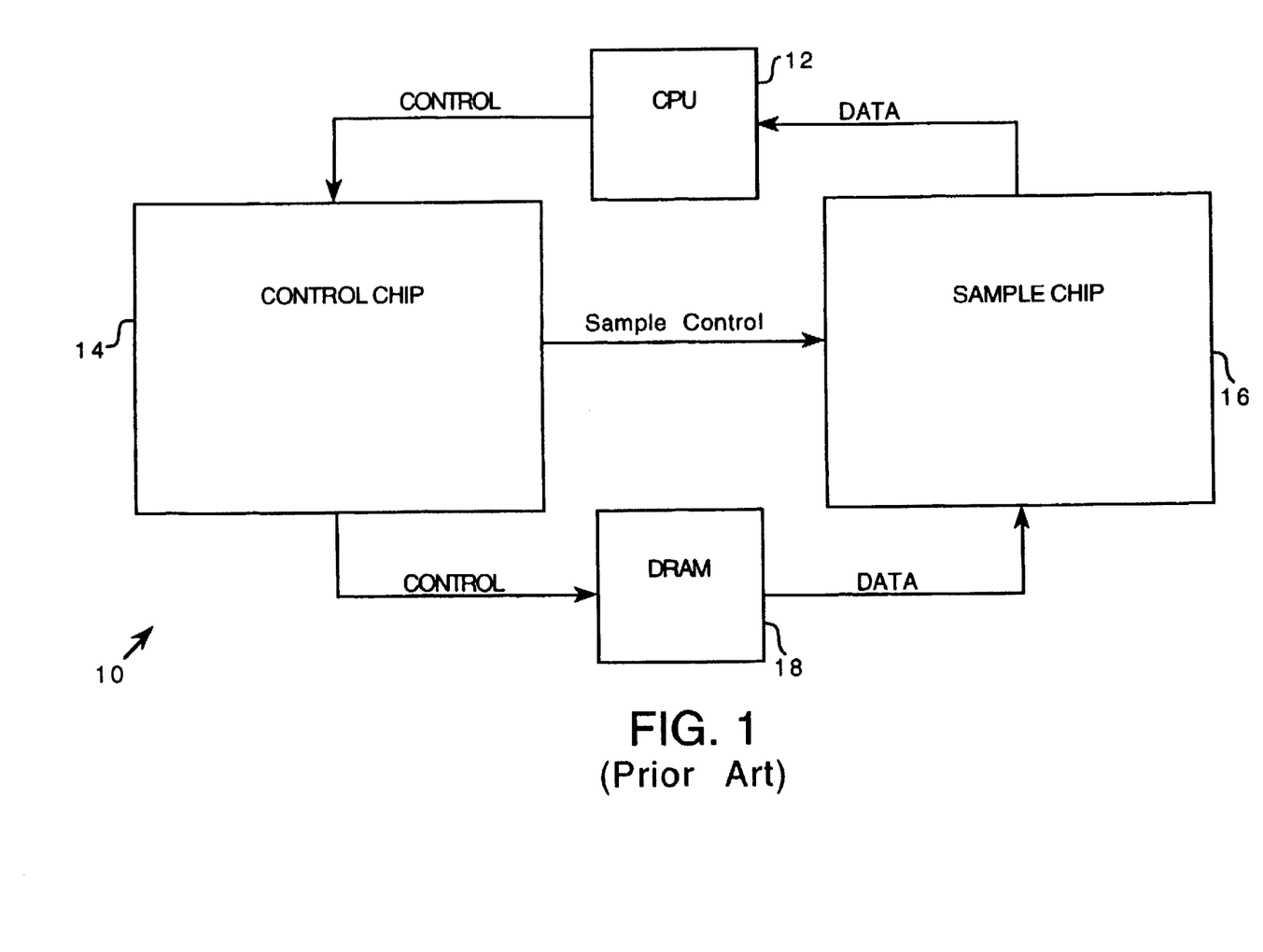
FIG. 1 is a block diagram showing a conventional integrated circuit chipset configured to control a computer DRAM.

FIG. 1 is a block diagram showing a conventional DRAM controller 10 implemented with control chip 14 containing the DRAM control circuitry, and sample chip 16 containing data sampling circuitry. CPU 12 provides control signals to transfer data out of DRAM 18. Control chip 14 receives the control signals from CPU 12 and converts them into other control signals understood by DRAM 18 including a memory address (MA) signal, a write enable (WE) signal, a row address strobe (RAS) signal and a column address strobe (CAS) signal. The CAS signal drives DRAM data to a valid state so it can be sampled. Sample chip 16 samples the DRAM data from DRAM 18 and provides a datapath to transfer the DRAM data to CPU 12. A typical DRAM read cycle is initiated when the CAS signal is asserted by control chip 14. DRAM 18 issues data at the requested address responsive to the asserted CAS signal. Control chip 14 also provides a sample control signal responsive to the CAS signal to sample chip 16 which may then sample the issued DRAM data. The CAS signal is generated in control chip 14 and data sampling occurs in sample chip 16.

Burst EDO DRAM permits data retrieval at high speeds and is designed to operate with a DRAM retrieval cycle equal to the system clock period. In supporting high-speed Burst EDO DRAM, significant timing problems can arise due to process variation and clock skew between control chip 14 and sample chip 16. Process variation refers to the process-speed inconsistencies between different copies of identically designed integrated circuits due to unavoidable slight differences in the physical composition of the silicon and dopants used to fabricate the integrated circuits. The fastest integrated circuits in the response-time range may be classified as "best-case" and the slowest may be classified as "worst-case." A best-case chip can be nearly twice as fast as a comparable worst-case chip. Clock skew refers to timing discrepancies between the separate internal core clocks driving each integrated circuit chip. Assuming identical process variation characteristics between chips, skew can still arise because of chip design differences. Given a master clock driving both chips, each chip buffers or amplifies the master clock as required to match its clock requirements. The buffered clock is the core clock. Since the number of internal structures being clocked (i.e., flip-flops) directly affects buffer delay, the two internal clocks are unavoidably skewed slightly. Process variation compounds the skew. Clock skew is typically measured as the worst-case process, maximum clock buffer delay (of all chips) minus the best-case process, minimum clock buffer delay (of all chips). Therefore, although closely aligned, each physically separate integrated circuit typically exhibits timing which is slightly offset relative to the norm of other copies of identical integrated circuits.

Figure 2:
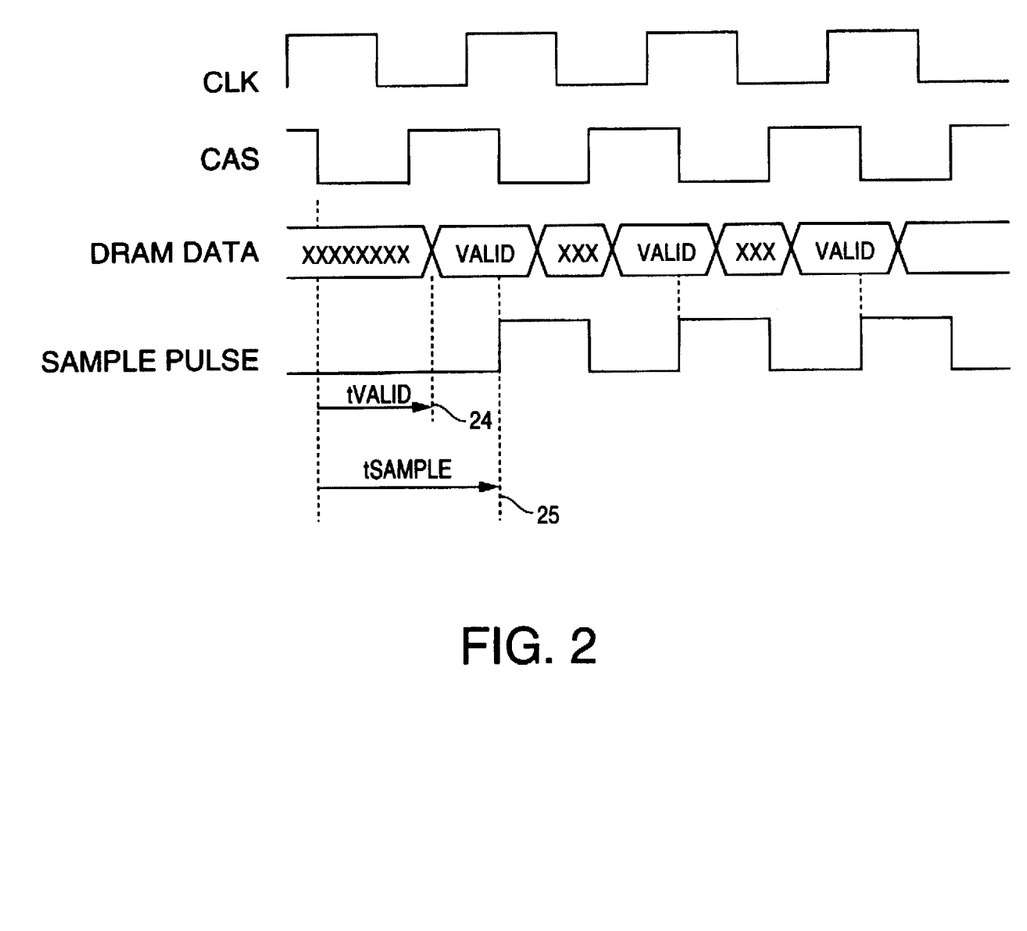
FIG. 2 is a waveform diagram showing ideal timing of a CAS pulse and a sample pulse for sampling DRAM data.

FIG. 2 is a waveform diagram showing ideal timing for a CAS pulse signal 21 and a sample pulse signal 23 used to sample DRAM data 22. CAS pulse signal 21 is an active-low signal which is asserted responsive to the rising edge of CLK pulse signal 20 with a slight time-lag due to propagation delay. At a time tVALID 24 after CAS 21 is asserted, DRAM data 22 becomes stable. Sample pulse 23 is generated by sample chip 16 in response to the sample control signal from the control chip 14. The sample control signal is sampled on the rising edge of CLK pulse 20, generating the sample pulse 23 with a propagation delay time-lag at time tSAMPLE 25. The sample control signal is generated by the control chip 14, one clock pulse prior to when the sample pulse 23 is needed, to give time for the sample control signal to travel between chips. At time tSAMPLE 25, data is sampled from the DRAM data 22 on the rising edge of sample pulse 23, during a period of valid data.

Figure 3:
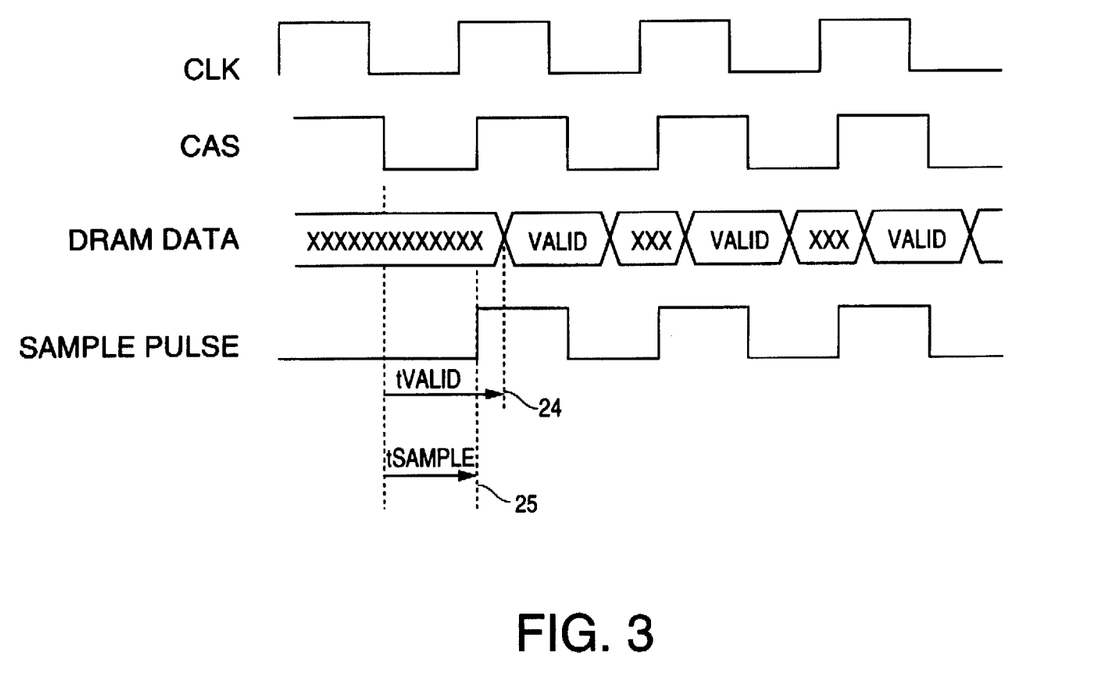
FIG. 3 is a waveform diagram showing a slow CAS pulse in combination with a fast sample pulse for sampling DRAM data.

In implementing a high-speed Burst EDO DRAM controller, significant timing problems may arise due to two different combinations of process variation. Consider the case with a best-case sample chip 16, in conjunction with a worst-case control chip 14. The DRAM control signals would be slow compared to a relatively fast sample pulse. FIG. 3 is a waveform diagram showing a fast sample pulse 23 for sampling DRAM data 22. Since time tSAMPLE 25 occurs before time tVALID 24, DRAM data 22 is not yet stable when the rising edge of sample pulse 25 samples DRAM data 22 and invalid data is therefore sampled.

Figure 4:
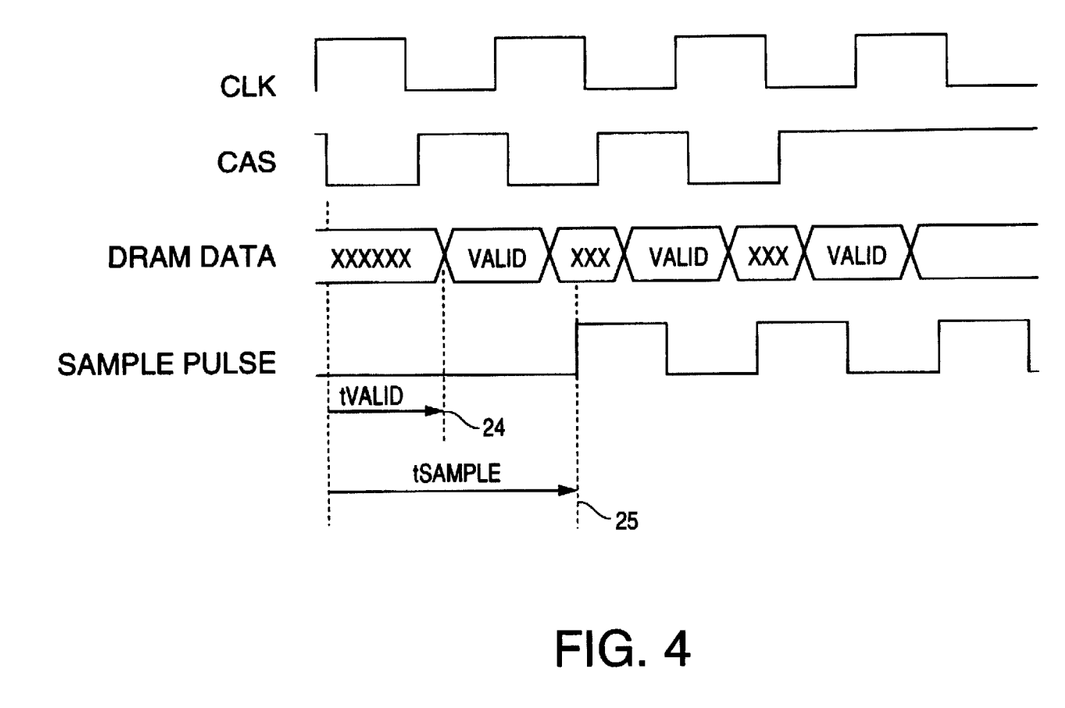
FIG. 4 is a waveform diagram showing a fast CAS pulse in combination with a slow sample pulse for sampling DRAM data.

Conversely, a worse-case sample chip 16 in conjunction with a best-case control chip 14 reverses the problem. The DRAM control signals would be fast compared to a relatively slow sample pulse. FIG. 4 is a waveform diagram showing a slow sample pulse 23 for sampling DRAM data 22. Since time tSAMPLE 25 occurs long after time tVALID 24, DRAM data 22 has already changed back to an invalid state and thus the rising edge of sample pulse 25 samples invalid data.

Sampling DRAM data 22 during a period of invalid data is unsatisfactory, and the problem increases with the greater timing demands of high-speed Burst EDO DRAM. Therefore, an improved system and method are needed for optimizing performance in a DRAM controller chipset.

SUMMARY OF THE INVENTION

The present invention discloses a system and method for using a programmable compensating device to optimize performance in a DRAM controller chipset. In the preferred embodiment of the present invention, a software program controls a central processing unit (CPU) to optimize performance in the chipset. Preferably, process monitors measure the process speed of each integrated circuit in the chipset. The process monitors may be implemented using ring oscillators which provide a series of output pulses having durations proportional to the process speed of the measured integrated circuit. The oscillator output pulses may be counted during a constant time interval to provide a process-speed value for the measured integrated circuit. Evaluation means such as the CPU then compares the measured process speeds for all of the chips in the set, identifies the slowest integrated circuit, and calculates delta values for each integrated circuit. A given integrated circuit's delta value is the difference between that integrated circuit's process speed and the slowest integrated circuit's process speed. The CPU then converts the calculated delta values into corresponding compensation-delay factors and uses the delay factors to program a respective delay module for each integrated circuit in the chipset. The delay modules may be comprised of a series of delay elements which can be selectively configured to provide a variable delay period. In accordance with the present invention, when the CPU applies the compensation-delay factors to the delay modules, the process speed for each integrated circuit is reduced to match the process speed of the slowest integrated circuit in the chipset. The access time to the DRAM is thus minimized, permitting accesses to be closer together, and thereby optimizing chipset performance.

DETAILED DESCRIPTION OF THE PREFERRED EMBODIMENT

The preferred embodiment of the present invention includes a programmable compensating device for optimizing performance in a DRAM controller chipset. More specifically, the present invention's compensating device corrects timing deviations between different integrated circuits by measuring the process speeds of the various integrated circuits and then delaying the faster chips to match the slowest chip in the integrated circuit chipset. The present invention thus minimizes overall access time to the DRAM, permitting multiple accesses to be placed closer together, and thereby optimizes chipset performance.

Figure 5:
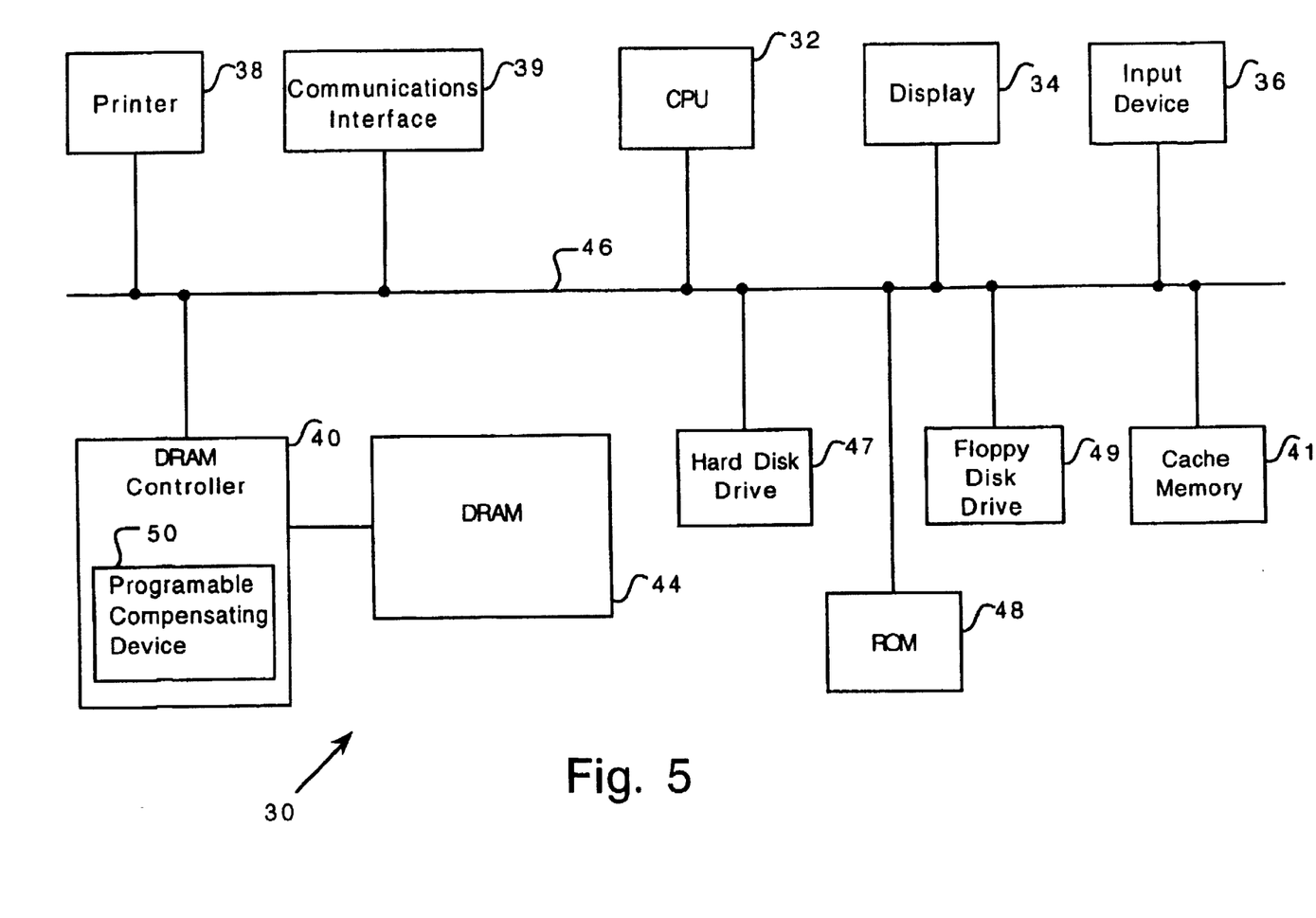
FIG. 5 is a block diagram of a computer system including the programmable compensating device of the present invention.

FIG. 5 is a block diagram of a computer system 30 having a DRAM controller 40 including a programmable compensating device 50 to optimize performance in the DRAM controller 40 chipset. Computer system 30 preferably, although not necessarily, comprises a central processing unit (CPU) 32, a video display 34, an input device 36, a printer 38, a communications interface 39, a dynamic random-access-memory (DRAM) 44, a hard disk drive 47, a read-only-memory (ROM) 48, a floppy disk drive 49, and cache memory 41. Each element of computer system 30 preferably has an input and an output coupled to a common system bus 46. The single system bus 46 shown connecting all devices may actually be implemented as one or more independent system buses, directly or indirectly connected or bridged in a manner to maximize performance.

Figure 6:
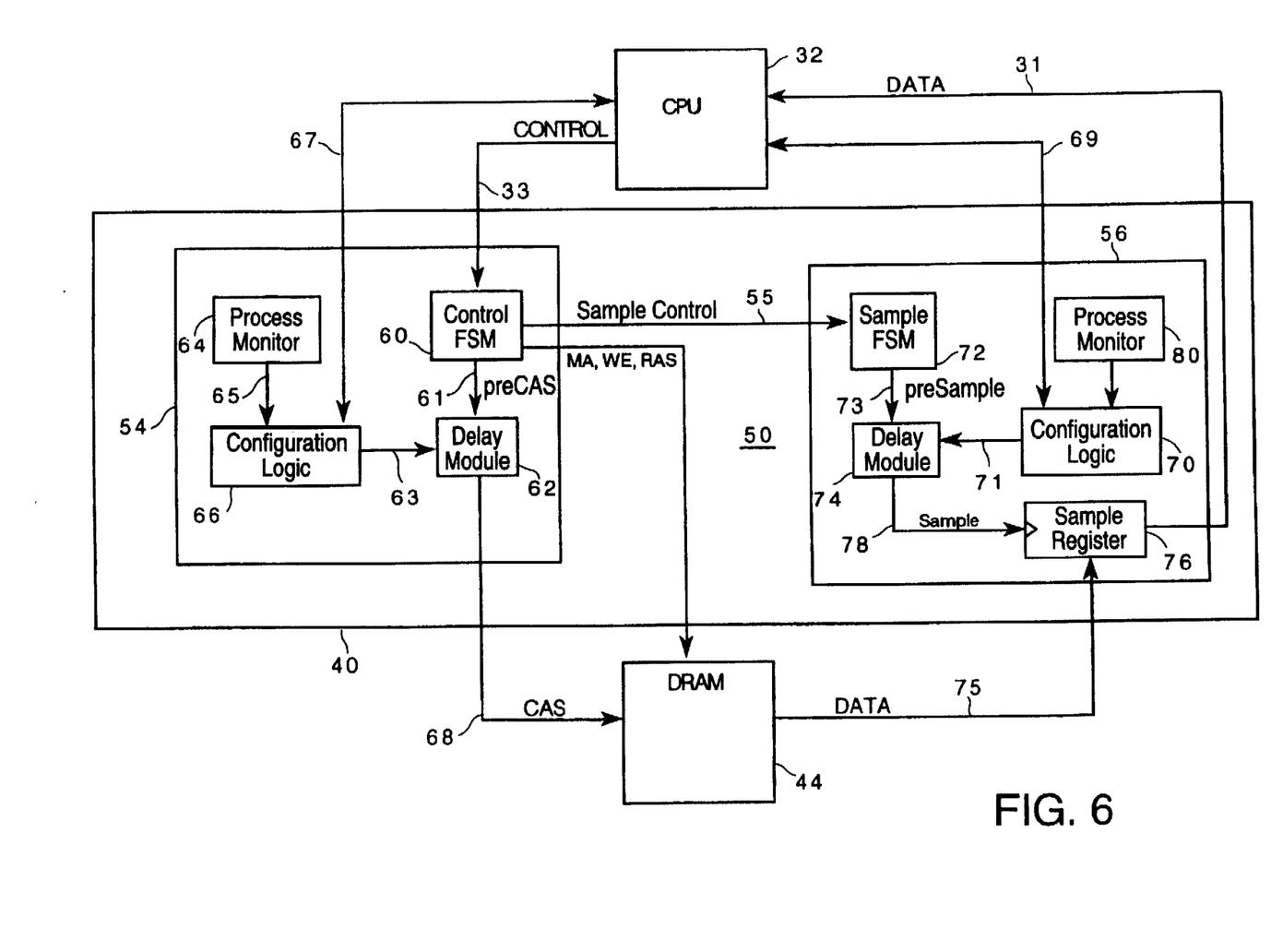
FIG. 6 is a block diagram showing the programmable compensating device of FIG. 5 implemented in a computer DRAM controller chipset.

FIG. 6 is a block diagram showing the programmable compensating device 50 of FIG. 5 having a control chip 54 and a sample chip 56 implemented within a computer DRAM controller 40 chipset. A control process monitor 64 measures the process speed of control chip 54 and provides the measurement to control configuration logic 66 which communicates over line 67 with CPU 32. Similarly, a sample process monitor 80 measures the process speed of sample chip 56 and provides the measurement to sample configuration logic 70 which communicates over line 69 with CPU 32.

CPU 32 generates DRAM control signals to write and retrieve data from DRAM 44, including a memory address (MA) signal, a write-enable (WE) signal, a row address strobe (RAS) signal, and the column address strobe (CAS) signal. CPU data signal input lines 31 and control signal output line 33 are part of system bus 46. Control chip 54 contains a control finite-state machine (FSM) 60 which, in response to the control signal provided by CPU 32, generates a preCAS signal on line 61 and also provides a sample control signal on line 55 to sample chip 56. In the preferred embodiment, the process speed measurement may be made when power is initially applied to the computer system 30, however, in other embodiments, the measurement may be made periodically. Control delay module 62 receives the preCAS signal on line 61 from control FSM 60 and responsively, with a variable delay according to the present invention, generates a column-address strobe (CAS) signal on line 68. DRAM 44 receives the requested memory address and the CAS signal on line 68, and responsively drives DRAM data valid at its output on lines 75, thereby providing the DRAM data to a sample register 76 in sample chip 56.

A sample finite-state machine (FSM) 72 in sample chip 56 receives a sample control signal on line 55 from control FSM 60 and responsively generates a preSample signal on line 73 which is provided to sample delay module 74. In the preferred embodiment, the process speed measurement may be made when power is initially applied to the computer system 30, however, in other embodiments, the measurement may be made periodically. Sample delay module 74 receives the preSample signal on line 73 from sample FSM 72 and responsively generates a Sample signal on line 78 to the clock input of sample register 76. The Sample signal on line 78 may be variably delayed according to the present invention to optimize performance of the DRAM controller 40 chipset. The Sample signal on line 78 clocks the DRAM data from lines 75 into sample register 76 and out onto data lines 31, whereby CPU 32 receives the DRAM output signals, and the data retrieval cycle is completed.

Figure 7:
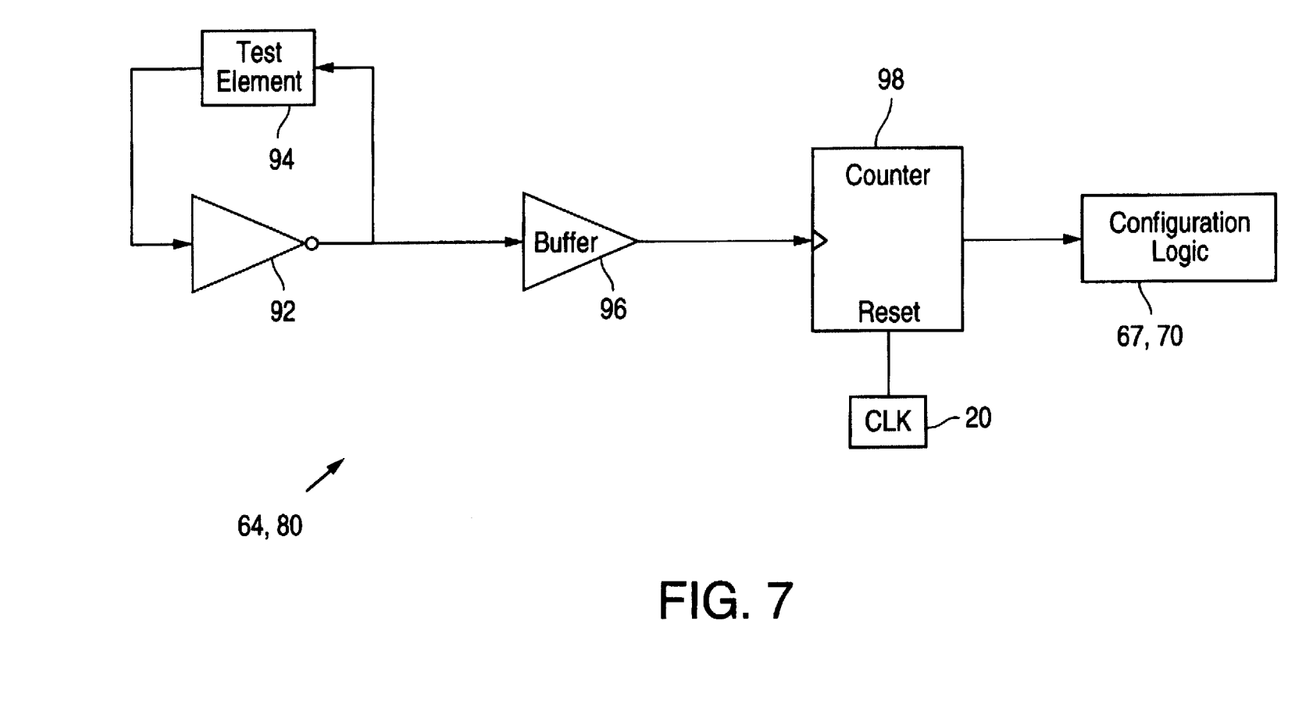
FIG. 7 is a schematic diagram showing a preferred embodiment of the process monitors of FIG. 6.

FIG. 7 is a schematic diagram showing a preferred embodiment for both control process monitor 64 and for sample process monitor 80 of FIG. 6. Embodiments equivalent to that of FIG. 7 may alternatively implement the process monitors. Since the components of a given integrated circuit are fabricated together from a single die of silicon, the components all have similar physical properties. Thus, the invention provides a test element 94 whose process speed is representative of the host integrated circuit's process speed for calculating a process speed for the particular host integrated circuit. For example, element 94 may be a buffer or other non-inverting digital logic gate having a relatively constant propagation time. Preferably, each integrated circuit in the chipset uses similar electronic components as test elements 94 and therefore each integrated circuit's process-speed measurement can be directly compared to the measurements of the other integrated circuits.

The output of test element 94 is fed into the input of inverter 92, whose output is then fed back into the input of test element 94 to form a ring oscillator which generates a series of output pulses at a fixed frequency. The oscillator output pulse duration is proportional to the test element 94 process speed. In the preferred embodiment, the oscillator output pulses are buffered by a buffer 96 to reduce loading problems, and then supplied to counter 98 where they are counted during a constant time interval equal to the period of a CLK signal 20 applied to the reset input of counter 98. The counter 98 output value represents the process speed of the host integrated circuit 54 or 56, and is provided to the respective configuration logic 66 or 70, which may be read by CPU 32. The CPU 32 accesses the configuration logic in chips 54 and 56 via the access paths 67 and 69. The access path may be implemented so that CPU 32 communicates directly to each chip, or indirectly through a single chip. One possible embodiment is to have a link between control chip 54 and sample chip 56 whereby configuration data is first passed from control chip 54 to sample chip 56, and then to CPU 32 via data lines 31.

Figure 8:
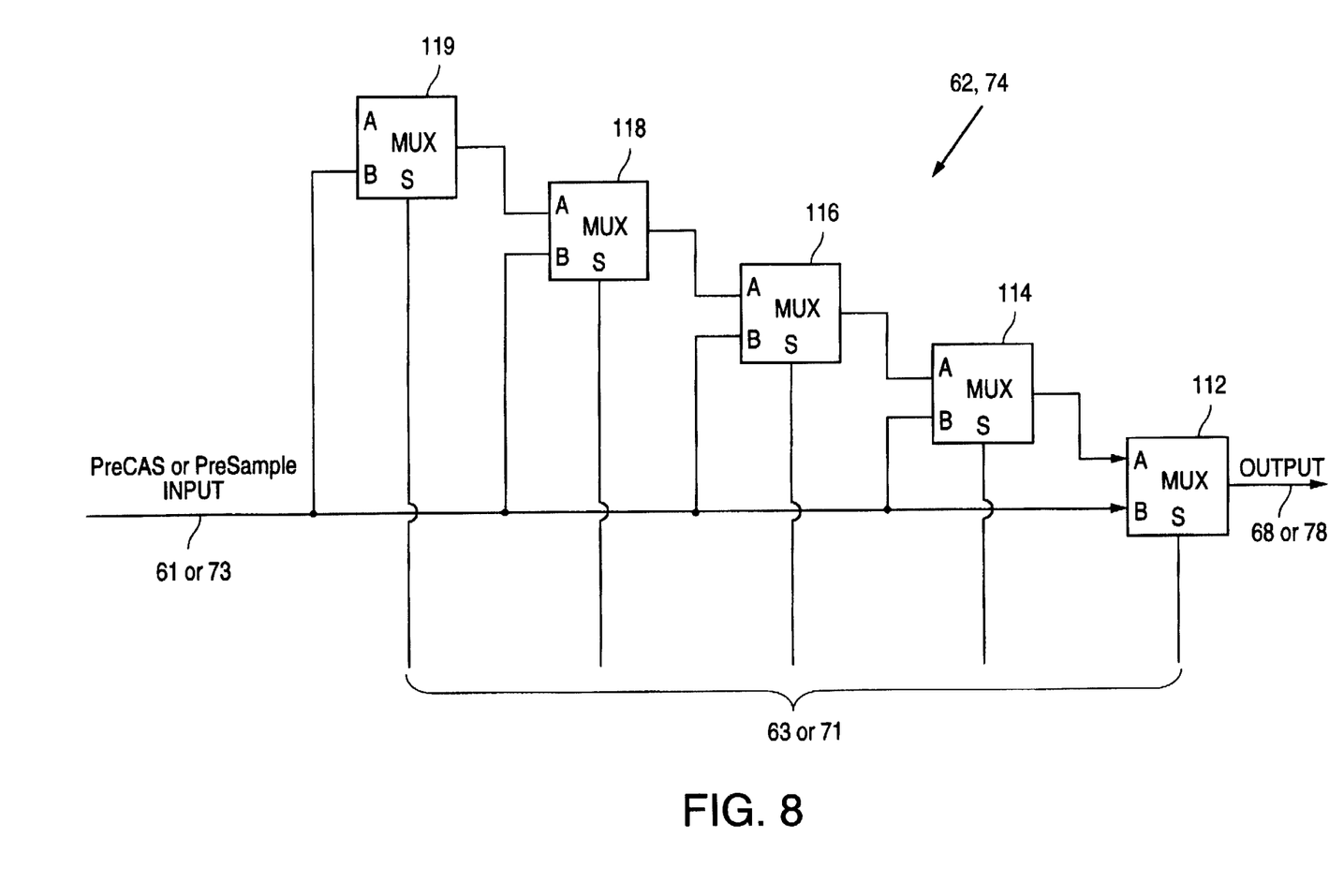
FIG. 8 is a schematic diagram showing a preferred embodiment of the delay modules of FIG. 6.

FIG. 8 is a schematic diagram showing a preferred embodiment for control delay module 62 and sample delay module 74 of FIG. 6. Alternate embodiments other than the FIG. 8 embodiment may equivalently be used to implement the delay modules. The FIG. 8 delay module is implemented using a series of multiplexers (MUXes) 112, 114, 116, 118, and 119 each having an input terminal A, an input terminal B, a select input terminal S for selecting either input A or input B as the active input, and an output terminal. In the preferred embodiment, a delay module input line 61 or 73 is connected to input B of each MUX in the series. In control chip 54, the module input line 61 receives the preCAS signal from control FSM 60. In sample chip 56, the module input line 73 receives the preSample signal from sample FSM 72. Each MUX output is supplied to the adjacent downstream MUX input A, except for MUX 112 output which is the delay module output. The control delay module 62 supplies the CAS signal on output line 68 to DRAM 44 and the sample delay module 74 supplies the sample signal on output line 78 to sample register 76. The select input S of each MUX is connected to configuration logic controlled by CPU 32 whereby, a variable number of MUX elements, depending upon the combination of input S values selected, can delay the module input signal.

Further, the number of MUX elements in the series may be varied depending upon the maximum amount of delay potentially desired. For example, the FIG. 8 embodiment may be extended by connecting an additional MUX element output to input terminal A of MUX 119, connecting the delay module input line to input B of the additional MUX element, and connecting a configuration logic line to the select input terminal S.

Figure 9:
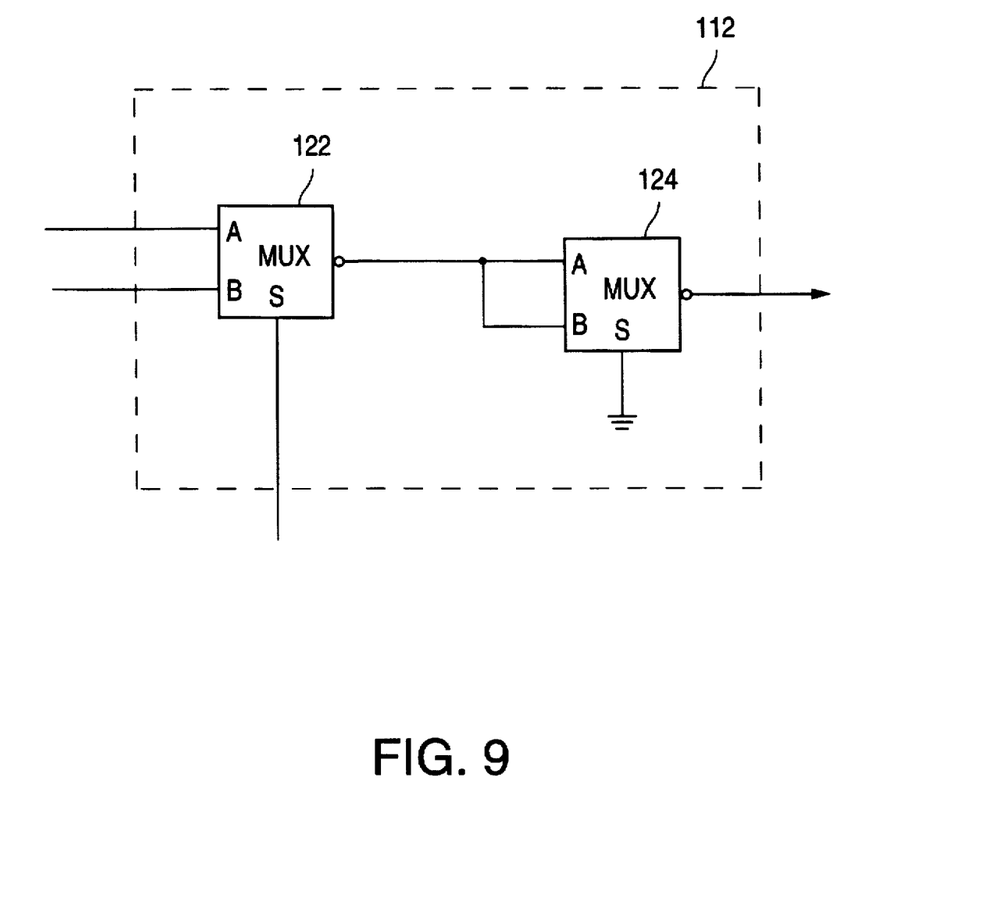
FIG. 9 is a schematic diagram showing an alternate configuration for the individual multiplexers of FIG. 8.

FIG. 9 is a schematic diagram showing an alternate configuration for the individual multiplexers (MUXes) of FIG. 8. In digital logic gates such as those of the FIG. 8 multiplexers, due to the gate architecture, digital low-to-high transitions are often different speeds than digital high-to-low transitions, which can distort propagated waveform shapes. To correct this problem, the output of a given delay element is inverted by an identical second delay element connected "back-to-back." Thereby, every input signal edge is subject to both a low-high and a high-low transition, which effectively cancels the distortion. FIG. 9 shows an alternative to the non-inverting MUXes 112, 114, 116, 118, 119 implemented with inverting MUX 122 whose output is applied to both input A and input B of inverting MUX 124. Additional extra inverting elements (in even numbers), serially connected as MUX 124, could extend the basic FIG. 9 device to increase the incremental delay value.

Figure 10:
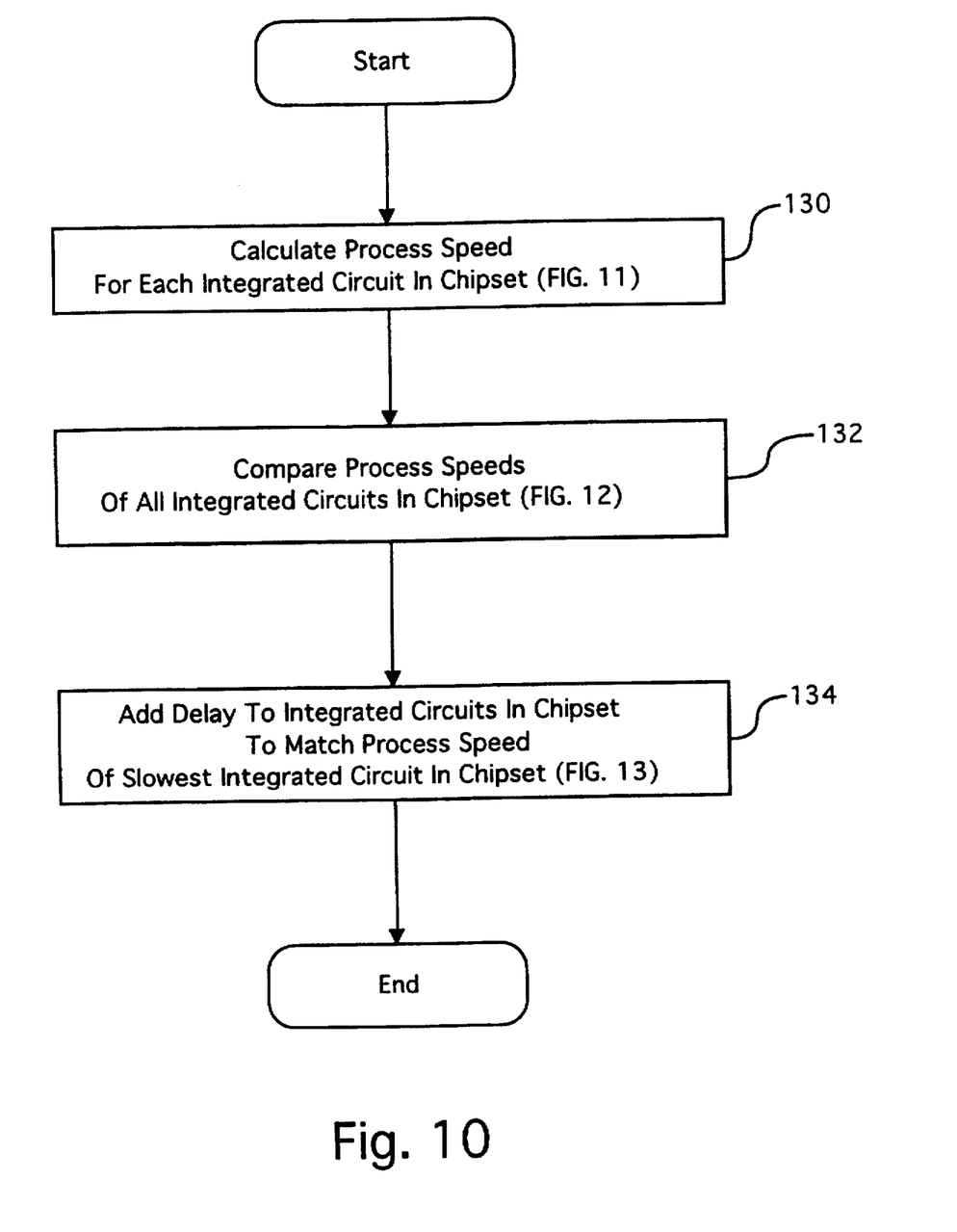
FIG. 10 is a flowchart showing the basic steps for optimizing performance in an integrated circuit chipset using the present invention.

FIG. 10 is a flowchart showing basic steps for optimizing the performance of an integrated circuit chipset according to the present invention. In step 130, a process speed for each integrated circuit in the chipset is calculated by CPU 32 reading the FIG. 7 process monitors 64 and 80 (FIG. 6), as detailed in the flowchart of FIG. 11. In step 132, CPU 32 compares the calculated process speeds of all integrated circuits in the chipset to identify the slowest integrated circuit, as detailed in FIG. 12. In step 134, CPU 32 selectively adjusts the delay modules and thereby adjusts delays slowing the process speed of other integrated circuits to match the slowest integrated circuit in the chipset, as detailed in FIG. 13.

Figure 11:
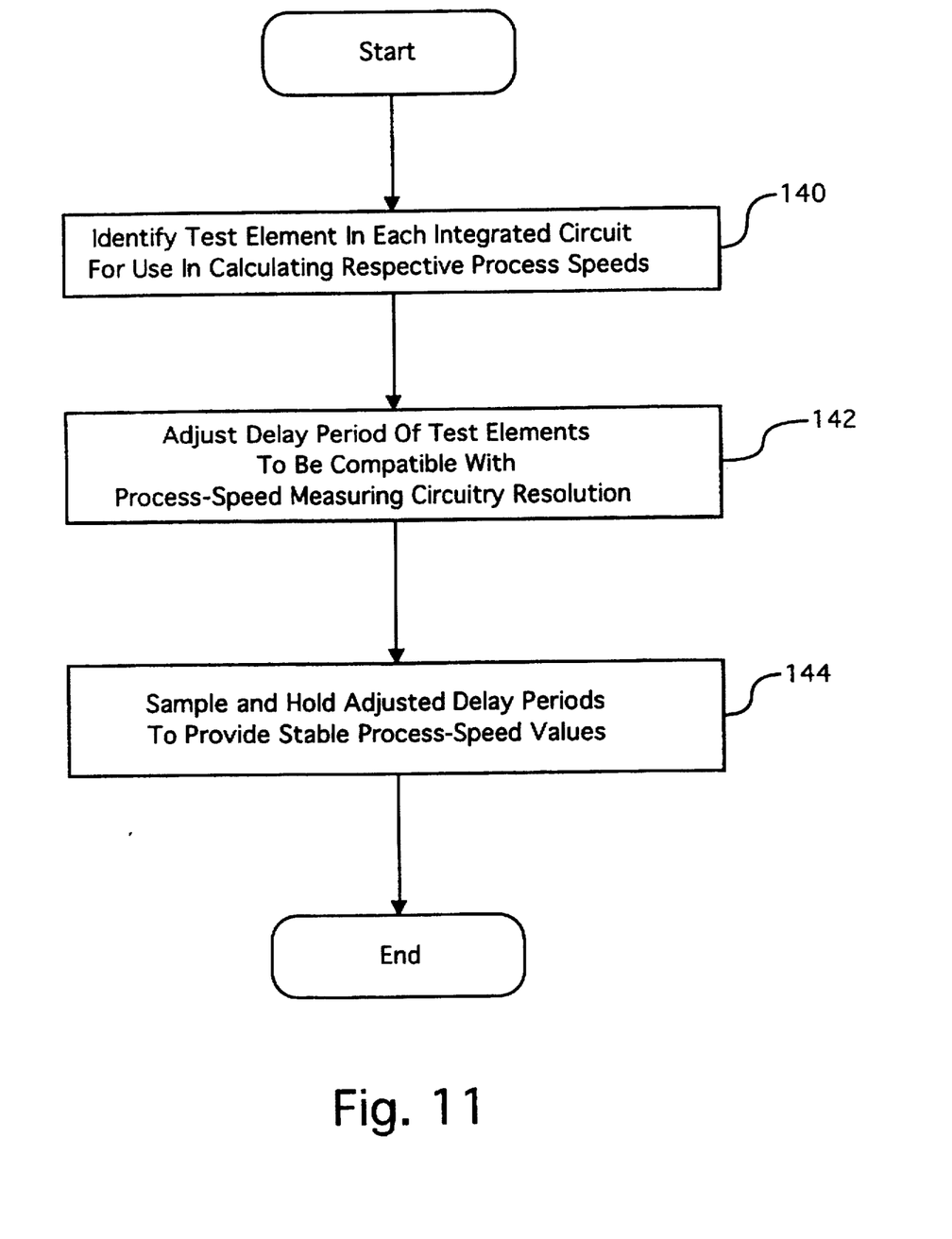
FIG. 11 is a flowchart showing detailed steps for the calculate process-speed step 130 of FIG. 10.

FIG. 11 is a flowchart detailing steps of FIG. 10 step 132 for calculating the process speed of each integrated circuit in a chipset. Step 140 identifies a test element 94 (FIG. 7) preferably inside each integrated circuit for use in calculating their respective process speeds. Since the components of a given integrated circuit are all fabricated from a single "die" of silicon, they all have very similar physical properties, and thus the process speed of test element 94 is representative of the process speed of the host integrated circuit. The preferred embodiment uses the same type of test element 94 in each integrated circuit being measured within a chipset.

Step 142 adjusts the delay period of each test element 94 to equal or exceed the minimum resolution of the process-speed measuring circuitry. The propagation delay of a typical digital logic gate is relatively short and may be advantageously increased to produce a more easily measurable value.

The preferred embodiment (FIG. 7), forms a ring oscillator in which test element 94 output is supplied to the input of inverter 92 whose output is in turn supplied to the input of test element 94. The ring oscillator thus produces a series of output pulses with durations proportional to the propagation delay of test element 94 and also of inverter 92.

Step 144 samples and holds the adjusted delay period of each test element 94 to provide stable process-speed values for each integrated circuit in the chipset. In the preferred embodiment, the ring oscillator output pulses are counted by a counter 98 which is reset by a clock signal CLK 20 at a constant time interval to produce a stable representative process-speed value for each integrated circuit in the chipset. In the preferred embodiment, the CPU 32 may hold the process-speed values in internal registers, however, in other embodiments, the process-speed values may be stored in various other types of storage devices.

Figure 12:
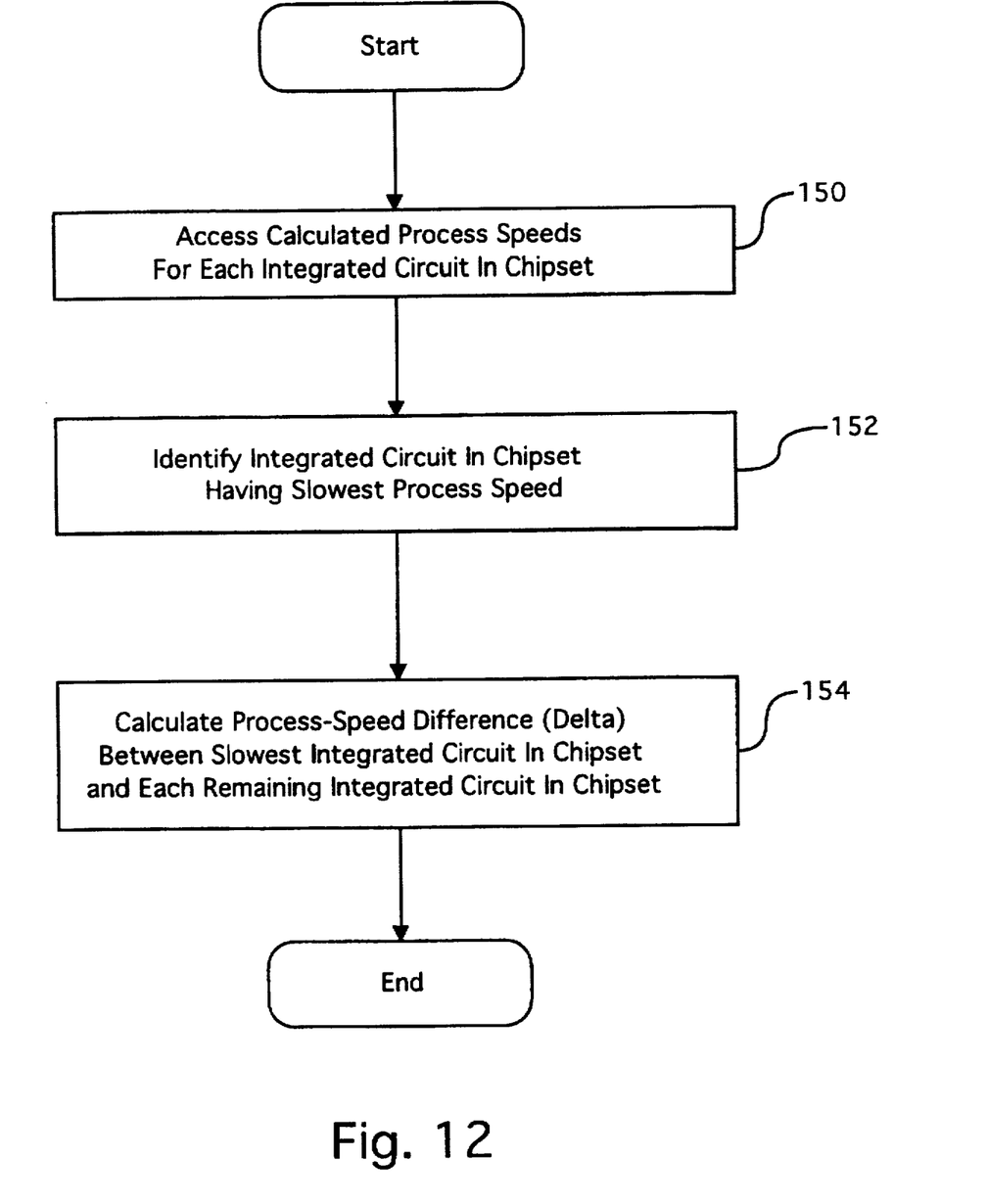
FIG. 12 is a flowchart showings detailed steps for the compare process-speed step 132 of FIG. 10.

FIG. 12 is a flowchart detailing steps of FIG. 10 step 132 for comparing the process speeds of integrated circuits in a chipset. The FIGS. 12 and 13 method steps are preferably performed by CPU 32 (FIG. 6) responsive to software programming, but the steps could alternatively be performed by other system hardware. Step 150 accesses each of the process speeds calculated for integrated circuits in a chipset. Step 152 compares the calculated process speeds to identify a slowest integrated circuit having the slowest process speed of all the integrated circuits in the chipset. In step 154, a delta value is calculated for each integrated circuit being compared. The delta value of given integrated circuit is the difference between that circuit's calculated process speed value and the slowest integrated circuit's calculated process speed value.

Figure 13:
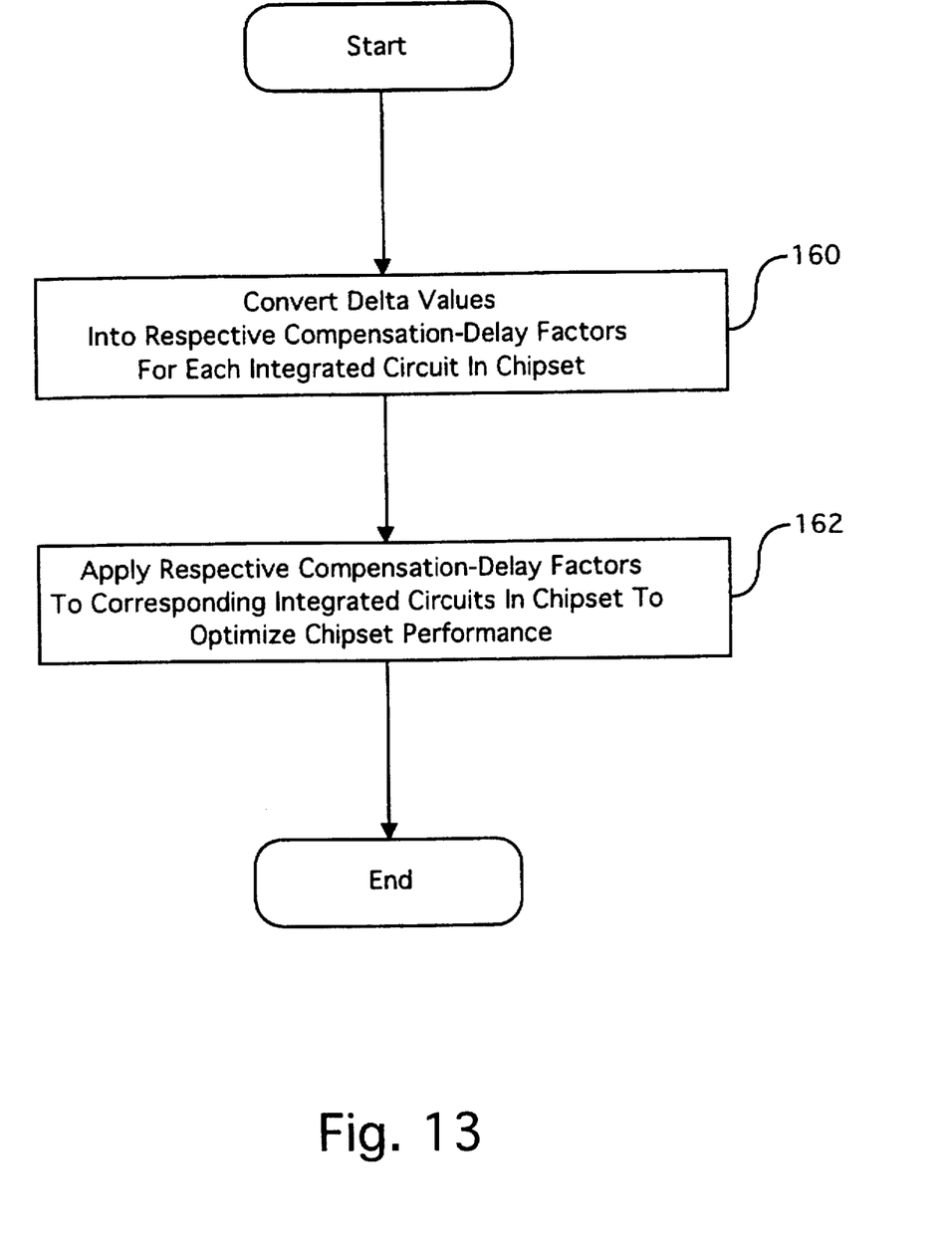
FIG. 13 is a flowchart showing detailed steps for the match process-speed step 134 of FIG. 10.

FIG. 13 is a flowchart detailing steps of FIG. 10 step 134 for adjusting the process speeds of integrated circuits in a chipset. In step 160, the FIG. 12 delta values for each integrated circuit are converted by CPU 32 into corresponding compensation-delay factors. Delta values may be converted into compensation-delay factors using a variety of methods. For example, the calculated delta values may be referenced to a pre-calculated, empirically-derived conversion table to determine the corresponding compensation-delay factors. A conversion table can effectively combine unique timing properties of different integrated circuit architectures with the calculated delta values to derive more accurate compensation-delay factors. Depending on the type of integrated circuits in the chipset and their applications, the present invention may also set a threshold delta value below which no compensation-delay factor is calculated. Finally, in step 162, CPU 32 applies the respective compensation-delay factors to delay modules in the corresponding integrated circuits to optimize performance of the chipset.

The present invention has been explained above with reference to a preferred embodiment. Other embodiments will be apparent to those skilled in the art in light of this disclosure. For example, the programmable compensating device could be implemented in an apparatus other than a DRAM controller. Further, the compensating device may be used to optimize performance in chipsets having more than the two integrated circuits. Therefore, these and other variations upon, and modifications to, the preferred embodiment are intended to be covered by the present invention, which is limited only by the appended claims.

What is claimed is:

1. A computer system that includes a central processing unit for controlling the computer system and a plurality of integrated circuits coupled to the central processing unit, the computer system comprising: a compensating device coupled to each of said integrated circuits, the compensating device including a process monitor connected to each of said integrated circuits for measuring process speed of each of said integrated circuits;

evaluation means for comparing the process speeds of said integrated circuits to identify a PATENT slowest integrated circuit among said plurality of integrated circuits;

delay module means for reducing the process speeds of each of said plurality of integrated circuits other than said slowest integrated circuit such that the reduced process speed of each of said plurality of integrated circuits matches the process speed of said slowest integrated circuit.

2. The computer system of claim 1 wherein each of said process monitors comprises:

a generator device for generating output pulses having durations proportional to the process speed of a respective one of said integrated circuits; and a measuring device for counting said output pulses during a constant time interval to obtain a representative process-speed value for the respective integrated circuit.

3. The computer system of claim 1 wherein said central processing unit is responsive to a performance optimizing software program to control said evaluation means and said delay module means.

4. The computer system of claim 1 wherein said compensating device comprises respective integrated process monitor circuitry, evaluation circuitry and delay circuitry included in each of said plurality of integrated circuits.

5. The computer system of claim 4 wherein said delay circuitry included in each of said plurality of integrated circuits comprises a series of delay elements which can be selectively configured to provide a variable delay period.

6. A controller for controlling a dynamic random access memory (DRAM) that is connected to each of a plurality of integrated circuits, the controller comprising: a compensating device, coupled to each of the integrated circuits, the compensating device including for each integrated circuit, a process monitor connected to said integrated circuit for measuring process speed of said integrated circuit;

evaluation means for comparing the process speeds of said integrated circuits to identify a slowest integrated circuit among said integrated circuits; and delay module means for reducing the process speed of each of said integrated circuits other than said slowest integrated circuit to match the process speed of said slowest integrated circuit.

7. The controller of claim 6 wherein each of said process monitors comprises:

a generator device for generating output pulses having durations proportional to the process speed of a respective one of said integrated circuits; and a measuring device for counting said output pulses during a constant time interval to obtain a representative process-speed value for the respective circuit.

8. The controller of claim 6 and further comprising a central processing unit responsive to a performance optimizing evaluation software program to control the evaluation means.

9. The controller of claim 6 wherein said delay module means included, for integrated circuit a delay module that includes a series of delay elements that can be selectively configured to provide a variable delay period for said integrated circuit.

10. The controller of claim 6 and further comprising a central processing unit responsive to a performance optimizing delay software program to control the delay module.

11. A method for optimizing performance in a chipset having a plurality of integrated circuits comprising the steps of:

calculating process speeds for said integrated circuits;

comparing said process speeds of said integrated circuits;

identifying a slowest integrated circuit; and reducing said process speeds of the integrated circuits other than said slowest integrated circuit to match the process speed of said slowest integrated circuit;

whereby response time of said chipset is minimized, thereby optimizing chipset performance.

12. The method of claim 11 wherein the step of calculating process speeds for each of the integrated circuits further comprises the steps of:

generating a series of output pulses having durations proportional to the process speed of one of the integrated circuits; and counting the output pulses during a constant time interval to obtain a representative process-speed value for said one of the integrated circuits.

13. The method of claim 11 wherein a central processing unit is responsive to a chipset performance optimizing software program to control the steps of comparing said process speeds and identifying a slowest integrated circuit.

14. The method of claim 11 wherein the step of reducing said process speeds is performed using delay modules having a series of delay elements which can be selectively configured to provide a variable delay period.

15. The method of claim 11 wherein a central processing unit is responsive to a chipset performance optimizing software program to control the step of reducing said process speeds.

16. The method of claim 11 wherein the step of reducing said process speeds further comprises the steps of:

calculating a delta value for each of the integrated circuits, said delta value for a given integrated circuit being the difference between the process speed of the given integrated circuit and the process speed of the slowest integrated circuit;

converting said delta values into corresponding compensation-delay factors for each of the integrated circuits; and delaying each of the integrated circuits using the corresponding compensation-delay factors.

17. A computer-useable medium embodying computer-readable program code for causing a computer system, having a central processing unit, a dynamic random-access memory, and a DRAM controller with a plurality of integrated circuits, to perform the steps of:

calculating process speeds for said integrated circuits;

comparing said process speeds;

identifying a slowest integrated circuit; and reducing said process speeds of the integrated circuits as necessary to match the speed of said slowest integrated circuit;

whereby access time of said dynamic random-access memory is minimized to permit more frequent accesses, thereby optimizing chipset performance.

18. The computer-useable medium of claim 17 wherein said steps of comparing, identifying, and reducing are controllable by a central processing unit responsive to a software program for optimizing performance of said integrated circuits.

* * * * *

UNITED STATES PATENT AND TRADEMARK OFFICE
CERTIFICATE OF CORRECTION

PATENT NO.: 5,781,766
DATED: July 14, 1998
INVENTOR(S): Ian Davis

It is certified that errors appear in the above-identified patent and that said Letters Patent is hereby corrected as shown below:

In Col. 7, line 65, delete "PATENT".

In Col. 8, line 57, delete "included, for integrated circuit" and replace with --includes, for each integrated circuit,--.

Signed and Sealed this

Twenty-second Day of September, 1998

Attest:

BRUCE LEHMAN

Attesting Officer

Commissioner of Patents and Trademarks